US009312447B2

(12) United States Patent
Han et al.

(10) Patent No.: US 9,312,447 B2
(45) Date of Patent: Apr. 12, 2016

(54) NEAR UV LIGHT EMITTING DEVICE

(71) Applicant: SEOUL VIOSYS CO., LTD., Ansan-si (KR)

(72) Inventors: Chang Suk Han, Ansan-si (KR); Hwa Mok Kim, Ansan-si (KR); Hyo Shik Choi, Ansan-si (KR); Mi So Ko, Ansan-si (KR); A Ram Cha Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/526,110

(22) Filed: Oct. 28, 2014

(65) Prior Publication Data

US 2015/0041760 A1     Feb. 12, 2015

Related U.S. Application Data

(63) Continuation-in-part of application No. 13/853,361, filed on Mar. 29, 2013, now Pat. No. 9,224,913.

(30) Foreign Application Priority Data

| Mar. 29, 2012 | (KR) | 10-2012-0032195 |
| Mar. 12, 2013 | (KR) | 10-2013-0025989 |
| Oct. 28, 2013 | (KR) | 10-2013-0128201 |

(51) Int. Cl.
  *H01L 33/06*  (2010.01)
  *H01L 33/32*  (2010.01)
  *H01L 33/04*  (2010.01)
  *H01L 33/14*  (2010.01)

(52) U.S. Cl.
  CPC ............... *H01L 33/32* (2013.01); *H01L 33/06* (2013.01); *H01L 33/04* (2013.01); *H01L 33/14* (2013.01)

(58) Field of Classification Search
  CPC .............................. H01L 33/06; H01L 33/32
  USPC .......................... 257/13, 15, E33.02, 79, 96
  See application file for complete search history.

(56) References Cited

U.S. PATENT DOCUMENTS

| 2005/0127391 A1* | 6/2005 | Yanamoto ..................... 257/103 |
| 2011/0017976 A1* | 1/2011 | Khan et al. ..................... 257/13 |
| 2011/0140079 A1 | 6/2011 | Jang et al. |
| 2011/0253974 A1 | 10/2011 | Horie et al. |

OTHER PUBLICATIONS

Final Office Action issued on Jan. 16, 2015, in U.S. Appl. No. 13/853,361.
Non-Final Office Action issued Jun. 6, 2014 in U.S. Appl. No. 13/853,361.

* cited by examiner

*Primary Examiner* — Chuong A Luu
*Assistant Examiner* — Rodolfo Fortich
(74) *Attorney, Agent, or Firm* — H. C. Park & Associates, PLC

(57) ABSTRACT

Disclosed is a near UV light emitting device. The light emitting device includes an n-type contact layer, a p-type contact layer, an active area of a multi-quantum well structure disposed between the n-type contact layer and the p-type contact layer, and at least one electron control layer disposed between the n-type contact layer and the active area. Each of the n-type contact layer and the p-type contact layer includes an AlInGaN or AlGaN layer, and the electron control layer is formed of AlInGaN or AlGaN. In addition, the electron control layer contains a larger amount of Al than adjacent layers to obstruct flow of electrons moving into the active area. Accordingly, electron mobility is deteriorated, thereby improving recombination rate of electrons and holes in the active area.

16 Claims, 5 Drawing Sheets

NEAR UV LIGHT EMITTING DEVICE

CROSS REFERENCE TO RELATED APPLICATIONS

This application is a continuation in part of U.S. application Ser. No. 13/853,361, filed on Mar. 29, 2013, and claims priority from and the benefit of Korean Patent Application No. 10-2012-0032195, filed on Mar. 29, 2012, Korean Patent Application No. 10-2013-0025989, filed on Mar. 12, 2013, and Korean Patent Application No. 10-2013-0128201, filed on Oct. 28, 2013 which are incorporated by reference for all purposes as if fully set forth herein.

BACKGROUND

1. Field

The present invention relates to an inorganic semiconductor light emitting device, and more particularly, to a near ultraviolet light emitting device.

2. Discussion of the Background

Generally, a gallium nitride-based semiconductor has been widely used in a blue/green light emitting diode or a laser diode as a light source of full color displays, traffic lighting, general lamps and optical communication instruments. In particular, an indium gallium nitride (InGaN) compound semiconductor has attracted considerable attention due to its narrow band gap.

This gallium nitride-based compound semiconductor has been utilized in various fields such as large-sized natural color flat panel display devices, light sources of backlight units, traffic lights, indoor lighting fixtures, high density light sources, high resolution output systems, optical communication, and the like. A light emitting device for emitting near ultraviolet light has been used in forgery discrimination, resin curing and ultraviolet treatment, and can realize various colors of visible light in combination with a fluorescent substance.

Near ultraviolet light refers to ultraviolet light at wavelengths ranging from about 320 nm to 390 nm. Gallium nitride GaN has an energy band gap of about 3.42 eV, which correspond to optical energy at a wavelength of about 365 nm. Accordingly, a light emitting device including an InGaN well layer can be used to emit near ultraviolet light at wavelengths of 365 nm or greater, that is, wavelengths from 365 nm to 390 nm according to In content.

Since light produced in the well layer is emitted to the outside through a barrier layer and a contact layer, a plurality of semiconductor layers is located in a path along which light travels, and light absorption occurs due to the semiconductor layers. In particular, when the semiconductor layers have a band gap smaller than or similar to those of the well layers, significant light loss occurs. In particular, it is necessary to control light absorption due to an n-type contact layer and a p-type contact layer occupying most of the thickness of the light emitting device.

Thus, in the near ultraviolet light emitting device in the related art, barrier layers, n-type contact layers, and p-type contact layers as well as electron blocking layers are formed of AlGaN which has a greater band gap than InGaN. However, since it is difficult to grow AlGaN relatively thick while ensuring good crystallinity of AlGaN, electric and optical characteristics of the near ultraviolet light emitting device are inferior to those of blue light emitting devices, and the near ultraviolet light emitting device is sold at a higher price than blue/green light emitting devices.

SUMMARY

Exemplary embodiments of the present invention provide an improvement in light output of a gallium nitride-based near UV light emitting device.

Exemplary embodiments of the present invention also provide a near UV light emitting device capable of improving crystallinity of an active layer.

Additional features of the invention will be set forth in the description which follows, and in part will be apparent from the description, or may be learned by practice of the invention.

An exemplary embodiment of the present invention discloses a light emitting device, including: an n-type contact layer including an AlGaN layer or AlInGaN layer; a p-type contact layer including an AlGaN layer or AlInGaN layer; an active area of a multi-quantum well structure disposed between the n-type contact layer and the p-type contact layer; and at least one electron control layer disposed between the n-type contact layer and the active area. In addition, the active area of the multi-quantum well structure includes barrier layers and well layers, in which the barrier layers are formed of AlInGaN or AlGaN, and a first barrier layer disposed nearest the n-type contact layer can contain a larger amount of Al than other barrier layers. The electron control layer may be formed of AlInGaN or AlGaN and contain a larger amount of Al than adjacent layers to obstruct flow of electrons moving into the active area. Accordingly, electron mobility may be deteriorated, thereby improving recombination rate of electrons and holes in the active area.

Particularly, the first barrier layer may also be formed to obstruct the flow of electrons. Accordingly, it is possible to achieve effective delay of electron flow by the first barrier layer and the electron control layer.

The light emitting device emits near UV light. Particularly, the active area of the multi-quantum well structure can emit near UV light in the wavelength range of 360 nm to 390 nm. In addition, the well layers can be formed of InGaN.

The barrier layers may contain indium (In), improving crystallinity of the well layers by relieving lattice mismatch between the well layers and the barrier layers.

The first barrier layer disposed nearest the n-type contact layer may contain a larger amount of Al than the other barrier layers by 5% or more, 10% or more, or 20% or more. In some embodiments, the first barrier layer disposed nearest the n-type contact layer may contain 30%~50% of Al.

As used herein, the content of a metal component represented by percent refers to a composition of the metal component with respect to a total sum of metal components of the gallium nitride-based layer represented by percent. That is, the content of Al in the gallium nitride-based layer represented by Formula $Al_xIn_yGa_zN$ is obtained by calculation of $100 \times x/(x+y+z)$ and represented by percent. Since $x+y+z=1$, percent of each of the metal components is a value obtained by multiplying a composition ratio (x, y or z) by 100.

The other barrier layers except for the first barrier layer can be formed of AlInGaN or AlGaN, which contains 10% to 30% of Al and 1% or less of In.

In one embodiment, the first barrier layer may be formed of AlInGaN, which contains 1% or less of In.

In some exemplary embodiments, the p-type contact layer may include a lower high density doping layer, an upper high density doping layer, and a low density doping layer disposed between the lower high density doping layer and the upper high density doping layer. In addition, the low density doping layer may have a greater thickness than the lower and upper high density doping layers. When the low density doping layer is formed to a greater thickness than other doping layers, it is possible to prevent absorption of light by the p-type contact layer.

The n-type contact layer may include a lower aluminum gallium nitride layer, an upper aluminum gallium nitride layer, and an intermediate layer of a multilayer structure disposed between the lower gallium nitride layer and the upper aluminum gallium nitride layer. By inserting the intermediate layer of the multilayer structure into the middle of the n-type contact layer, it is possible to improve crystallinity of epitaxial layers on the n-type contact layer. Particularly, the intermediate layer of the multilayer structure can have a structure in which AlInN and GaN are alternately stacked one above another.

The n-type contact layer may also include a modulation-doped AlGaN layer. The upper aluminum gallium nitride layer can be the modulation-doped layer.

The light emitting device may further include a super-lattice layer disposed between the n-type contact layer and the active area; and an electron implantation layer disposed between the super-lattice layer and the active area. The electron implantation layer may have a higher n-type impurity doping concentration than the super-lattice layer and the first barrier layer can adjoin the electron implantation layer. As the first barrier layer is disposed to adjoin the electron implantation layer having a relatively high n-type impurity doping concentration, it is possible to achieve effective delay of electron flow.

The light emitting device may further include an anti-electrostatic discharge layer disposed between the n-type contact layer and the super-lattice layer, and a first electron control layer can be disposed between the anti-electrostatic discharge layer and the super-lattice layer. The anti-electrostatic discharge layer may prevent electrostatic discharge by recovering crystallinity of the active area that deteriorates due to doping the n-type contact layer including AlGaN or AlInGaN with impurities.

In some exemplary embodiments, the anti-electrostatic discharge layer may include an undoped AlGaN layer; a low concentration AlGaN layer doped with a lower concentration of n-type impurities than the n-type contact layer; and a high concentration AlGaN layer doped with a higher concentration of n-type impurities than the low concentration AlGaN layer, in which the low concentration AlGaN layer can be disposed between the undoped AlGaN layer and the high concentration AlGaN layer. The undoped AlGaN layer may recover crystallinity of the active area while gradually increasing the doping concentration, thereby maintaining crystallinity of layers growing thereon. Furthermore, the first electron control layer can adjoin the high concentration AlGaN layer. The first electron control layer may be disposed to adjoin the high concentration AlGaN layer, thereby effectively delaying the flow of electrons.

The n-type contact layer and the super-lattice layer may contain less than 10% of Al and the first electron control layer can contain 10% to 20% of Al.

On the other hand, a second electron control layer may be disposed between the n-type contact layer and the anti-electrostatic discharge layer. The n-type contact layer and the anti-electrostatic discharge layer may contain less than 10% of Al and the second electron control layer may contain 10% to 20% of Al.

According to exemplary embodiments of the invention, the light emitting device can increase recombination rate of electrons and holes by an electron control layer obstructing the flow of electrons and a first barrier layer containing a larger amount of Al than other barrier layers, thereby improving light output. Furthermore, an anti-electrostatic discharge layer and/or a super-lattice layer are disposed between the n-type contact layer and the active area to improve crystallinity of the active area, thereby improving light output.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
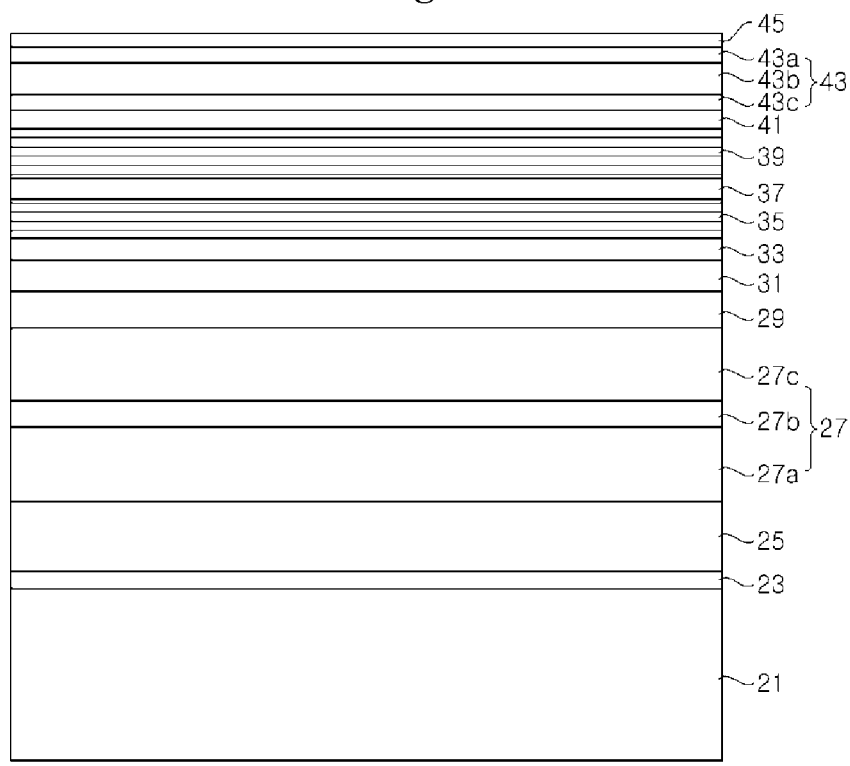
FIG. 1 is a sectional view of a light emitting device according to one exemplary embodiment of the present invention.

Hereinafter, exemplary embodiments of the invention will be described in detail with reference to the accompanying drawings. The following embodiments are given by way of illustration to provide a thorough understanding of the present invention to those skilled in the art. Thus, the present invention is not limited to the following embodiments, and can be realized in various ways. It should be noted that the drawings are not to precise scale and some of the dimensions, such as width, length, thickness, and the like, are exaggerated for clarity of description in the drawings. Like elements are denoted by like reference numerals throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a sectional view of a light emitting device according to one exemplary embodiment of the present invention, and FIG. 2 is a sectional view of a multi-quantum well structure of the light emitting device according to the exemplary embodiment of the present invention.

Figure 2:
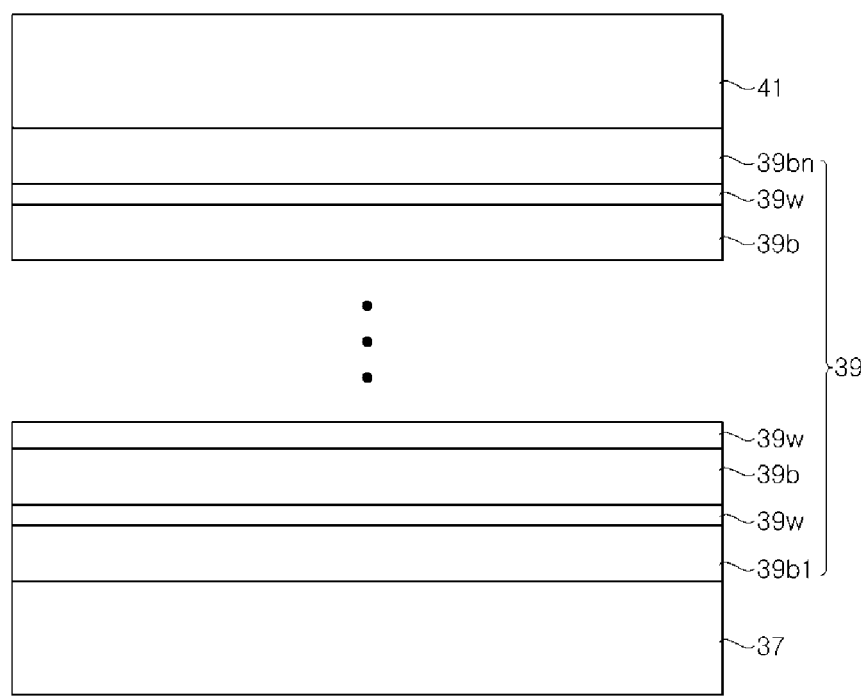
FIG. 2 is a sectional view of a multi-quantum well structure of the light emitting device according to the exemplary embodiment of the present invention.

Referring to FIG. 1, a light emitting device according to one embodiment includes an n-type contact layer 27, an active area 39, and a p-type contact layer 43. Further, the light emitting device can include a substrate 21, a nucleation layer 23, a buffer layer 25, an undoped GaN layer 29, a low-density GaN layer 31, a high-density GaN layer 33, a superlattice layer 35, an electron implantation layer 37, an electron blocking layer 41, or a delta doping layer 45.

The substrate 21 is a substrate for growing a GaN-based semiconductor layer, and includes a sapphire substrate, a silicon carbide (SiC) substrate, or a spinel substrate, without being limited thereto. For example, the substrate 21 can be a patterned sapphire substrate (PSS).

The nucleation layer 23 can be formed of (Al, Ga)N, at temperatures ranging from 400° C. to 600° C., to grow the buffer layer 25 on the substrate 21. The nucleation layer 23 is formed of GaN or AlN. The nucleation layer 23 can be formed to a thickness of about 25 nm. The buffer layer 25 is grown at relatively high temperatures to relieve defect occurrence, such as dislocation, between the substrate 21 and the n-type contact layer 27. For example, the buffer layer 25 can be formed of undoped GaN and can have a thickness of about 1.5 μm.

The n-type contact layer 27 can be an n-type impurity-doped semiconductor layer, for example, Si-doped, GaN-based semiconductor layer, and can be formed to a thickness of about 3 μm. The n-type contact layer 27 can include a GaN layer and can have a single layer or multilayer structure. For example, as shown, the n-type contact layer 27 can include a lower GaN layer 27a, an intermediate layer 27b, and an upper GaN layer 27c. Here, the intermediate layer 27b can be formed of AlInN, or can have a multilayer structure (including a superlattice structure) in which AlInN and GaN are alternately stacked, for example, in about 10 cycles. The lower GaN layer 27a and the upper GaN layer 27c can be formed to similar thicknesses of, for example, about 1.5 μm. The intermediate layer 27b can be formed to a smaller thickness than the lower and the upper GaN layers 27a, 27c. For example, the intermediate layer 27b can have a thickness of about 80 nm. As compared with the case where a single GaN layer is continuously grown at a relatively high thickness of about 3 mm, the intermediate layer 27b is inserted into an intermediate section of the n-type contact layer 27.

As such, crystal quality of an epitaxial layer, specifically, the active area 39 formed on the n-type contact layer 27, can be improved. A doping density of Si doped into the n-type contact layer 127 can range from $2\times10^{18}/cm^3$ to $2\times10^{19}/cm^3$, or from $1\times10^{18}/cm^3$ to $2\times10^{19}/cm^3$. In particular, the lower GaN layer 27a and the upper GaN layer 27c can be doped with Si impurities at a high density, and the intermediate layer 27b can be doped with the Si impurities at a lower or the same density as that of the upper GaN 27c, or can not be intentionally doped therewith. Since the lower GaN layer 27a and the upper GaN layer 27c are doped with the Si impurities at a high density, the resistance of the n-type contact layer 27 can be reduced. An electrode contacting the n-type contact layer 27 can contact the upper GaN layer 27c as well.

The undoped GaN layer 29 can be formed of GaN that is not doped with the impurities, and can be formed to a smaller thickness than the upper GaN layer 27c. For example, the undoped GaN layer 29 can have a thickness of 80 nm to 300 nm. As the n-type contact layer 27 is doped with n-type impurities, the n-type contact layer 27 has residual stress and a low crystal quality. Accordingly, when another epitaxial layer is grown on the n-type contact layer 27, it is difficult to grow an epitaxial layer having good crystal quality. However, since the undoped GaN layer 29 is not doped with any impurity, the undoped GaN layer 29 acts as a recovery layer for recovering the crystal quality of the n-type contact layer 27. Thus, the undoped GaN layer 29 can be directly formed on the n-type contact layer 27 to adjoin the n-type contact layer 27. In addition, since the undoped GaN layer 28 has a higher resistivity than the n-type contact layer 27, electrons introduced from the n-type contact layer 27 to the active layer 39 can be evenly distributed within the n-type contact layer 27, before passing through the undoped GaN layer 29.

The low-density GaN layer 31 is placed on the undoped GaN layer 29 and has a lower n-type impurity doping density than the n-type contact layer 27. The low-density GaN layer 31 can have a Si doping density ranging, for example, from $5\times10^{17}/cm^3$ to $5\times10^{18}/cm^3$ and can be formed to a smaller thickness than the undoped GaN layer 29. For example, the low-density GaN layer 31 can have a thickness of 50 nm to 150 nm. The high-density GaN layer 33 is placed on the low-density GaN layer 31 and has a higher n-type impurity doping density than the low-density GaN layer 31. The high-density GaN layer 33 can have an Si doping density similar to that of the n-type contact layer 27. The high-density GaN layer 33 can have a smaller thickness than the low-density GaN layer 31. For example, the high-density GaN layer 33 can have a thickness of about 30 nm.

The n-type contact layer 27, the undoped GaN layer 29, the low-density GaN layer 31, and the high-density GaN layer 33 can be continuously grown by supplying a metal source gas into a chamber. Organometallic materials including Al, Ga and In, such as trimethylaluminum (TMA), trimethylgallium (TMD), and/or trimethlyindium (TME), are used as a metal source gas. Silane $SiH_4$ can be used as a source gas of Si. These layers can be grown at a first temperature of, for example, 1050° C. to 1150° C.

The superlattice layer 35 is placed on the high-density GaN layer 33. The superlattice layer 35 can be formed by alternately stacking first and second InGaN layers having different compositions in about 30 cycles, in which each of the InGaN layers has a thickness of 20 Å. The indium content of the first and second InGaN layers is lower than that of well layers 39w in the active area 39. The superlattice layer 35 can be formed of an undoped layer without any intentionally doped impurities. Since the superlattice layer 35 is formed of the undoped layer, current leakage of the light emitting device can be reduced.

The electron implantation layer 37 has a higher n-type impurity doping density than the superlattice layer 35. In addition, the electron implantation layer 37 can have substantially the same n-type impurity doping density as the n-type contact layer 27. For example, the n-type impurity doping density can range from $1\times10^{19}/cm^3$ to $5\times10^{19}/cm^3$, or from $1\times10^{19}/cm^3$ to $3\times10^{19}/cm^3$. Since the electron implantation layer 37 is doped at a high density, implantation of electrons into the active area 39 can be facilitated. The electron implantation layer 37 can be formed to a similar or smaller thickness than the high-density doping layer 33. For example, the electron implantation layer 37 can have a thickness of 20 nm. Moreover, the electron implantation layer 37 can be grown at a pressure of about 300 torr and a temperature of about 820° C. to 850° C.

The active area 39 is placed on the electron implantation layer 37. FIG. 2 is an enlarged sectional view of the active area 39.

Referring to FIG. 2, the active area 39 has a multi-quantum well structure including barrier layers 39b and well layers 39w, which are alternately stacked one above another. The well layers 39w have a composition capable of emitting near-ultraviolet light ranging from 365 nm to 390 nm. For example, the well layers 39w can be formed of InGaN or AlInGaN, for example. Here, the In content of the well layers 39w is determined according to wavelengths of ultraviolet light. For example, the In content of the well layers 39w can range from about 2% to 5% (accordingly, the Ga content ranges from about 95% to 98%). Each of the well layers 39w can have a thickness of about 20 Å to 30 Å. The well layers 39w can be grown at a higher temperature than the well layers of a general blue light emitting diode, for example, 800° C. to 820° C., at a pressure of about 300 Torr. As such, the well layers can have improved crystal quality.

The barrier layers 39b can be formed of gallium nitride-based semiconductor layers having a wider band gap than the well layers. For example, the barrier layers can be formed of GaN, InGaN, AlGaN, or AlInGaN. In particular, since the barrier layers 39b can be formed of AlInGaN and thus, contain In, a lattice mismatch between the well layers 39w and the barrier layers 39b can be relieved.

Furthermore, the barrier layers 39b can be grown at a slightly higher growth temperature than the growth temperature of the well layers 39w. For example, the barrier layers 39b can be grown at temperatures of about 820° C. to 850° C., at a pressure of about 300 Torr.

A first barrier layer 39b1 of the barrier layers 39b1, 39b, 39bn, which is closest to the electron implantation layer 37 or the n-type contact layer 27, has a higher Al content than the other barrier layers. For example, the first barrier layer 39b1 can contain 10% to 20% more Al than the other barrier layers 39b. For example, when the other barrier layers 39b, 39bn include about 20% of Al, the first barrier layer 39b1 can include about 30% to 40% of Al. The barrier layers 39b1, 39b, 39bn contain about 1% or less of indium. In particular, when the well layers 39b are formed of InGaN to emit near-ultraviolet light of 375 nm to 390 nm, the barrier layers 39b and 39bn other than the first barrier layer 39b1 can be formed of AlInGaN which contains 15% to 25% of Al and about 1% or less of In, and the first barrier layer 39b can be formed of AlInGaN which contains 30% to 40% of Al and 1% or less of In.

In general, barrier layers are formed to have the same composition in a light emitting device. However, in the present embodiment, the first barrier layer 39b1 contains 10% to 20% more Al than the other barrier layers 39b. The electron implantation layer 37 or the n-type contact layer 27 is formed of GaN. A difference between band gaps of the well layer 39w capable of emitting near-ultraviolet light and GaN is not relatively large. Accordingly, the first barrier layer 39b1 is formed to have a higher band gap than the other barrier layers 39b, thereby confining carriers in the active area 39. In particular, when the AlInGaN barrier layer is used, a moving speed of holes is significantly decreased, whereby an overflow probability of electrons can be increased. In this case, although it can be considered that the thickness of the electron blocking layer 41 is increased to prevent overflow of electrons, an increase in thickness of the electron blocking layer 41 for efficient implantation of holes into the active area is restricted.

Accordingly, the first barrier layer 39b1 is formed to have a wider band gap (about 0.5 eV or higher) than the other barrier layers, to effectively prevent the overflow of electrons, by decreasing the moving speed of the electrons. However, when the Al content of the first barrier layer 39b1 is increased by about 20% or more, a lattice mismatch can occur between the first barrier layer 39b1 and the electron implantation layer 37, and a lattice mismatch between the first barrier layer 39b1 and the well layer 39w can become severe, thereby reducing the crystal quality of the active area 39.

The first barrier layer can have substantially the same or greater thickness (for example, of about 40 Å) than the other barrier layers except for the last barrier layer, which is closest to the electron blocking layer 41 or the p-type contact layer 43. For example, the first barrier layer can have a thickness of 40 Å to 60 Å, specifically about 45 Å.

The active area 39 can adjoin the electron implantation layer 37. The barrier layer and the quantum well layer of the active area 39 can be formed of an undoped layer to improve the crystal quality of the active layer, and some portion or the entirety of the active area can be doped with impurities to reduce forward voltage.

Referring again to FIG. 1, the p-type contact layer 43 can be placed on the active area 39, and the electron blocking layer 41 can be placed between the active area 39 and the p-type contact layer 43. The electron blocking layer 41 can be formed of AlGaN or AlInGaN, to relieve lattice mismatch between the p-type contact layer and the active area 39. The electron blocking layer 41 can contain 36% of Al and 3% of In. The electron blocking layer 41 can be doped with p-type impurities, for example Mg, at a doping density of $5 \times 10^{19}/cm^3$ to $2 \times 10^{20}/cm^3$.

The p-type contact layer 43 can include a lower high-density doping layer 43a, a low-density doping layer 43b, and an upper high-density doping layer 43c. The lower high-density doping layer 43a and the upper high-density doping layer 43c can be doped with p-type impurities, for example Mg, at a doping density of $5 \times 10^{19}/cm^3$ to $2 \times 10^{20}/cm^3$. The low-density doping layer 43b has a lower doping density than the lower and upper high-density doping layers 43a, 43c and is placed therebetween. The low-density doping layer 43b can be grown, with the supply of a source gas Mg (for example, $Cp_2Mg$) interrupted during growth thereof.

During growth of the low-density doping layer 43b, the impurity content can be reduced using $N_2$ gas as a carrier gas instead of using $H_2$. The low-density doping layer 43b is formed to a greater thickness than the upper and lower high-density doping layers 43c, 43a. For example, the low-density doping layer 43b can be formed to a thickness of about 60 nm, and each of the upper and lower high-density doping layers 43c, 43a can be formed to a thickness of 10 nm. As a result, the p-type contact layer 43 has improved crystal quality and a reduced impurity density, thereby preventing or relieving the loss of near-ultraviolet light due to the p-type contact layer 43.

The delta doping layer 45 can be placed on the p-type contact layer 43 to decrease ohmic contact resistance. The delta doping layer 45 is doped with p-type or n-type impurities at a high density to decrease the ohmic resistance between the electrode and the p-type contact layer 43. The delta doping layer 45 can be formed to a thickness of about 2 Å to 5 Å.

A light emitting device of a lateral structure or flip chip structure can be manufactured by patterning the epitaxial layers on the substrate 21. Further, a light emitting device of a vertical structure can be manufactured by removing the substrate 21.

Experimental Example 1

Figure 3:
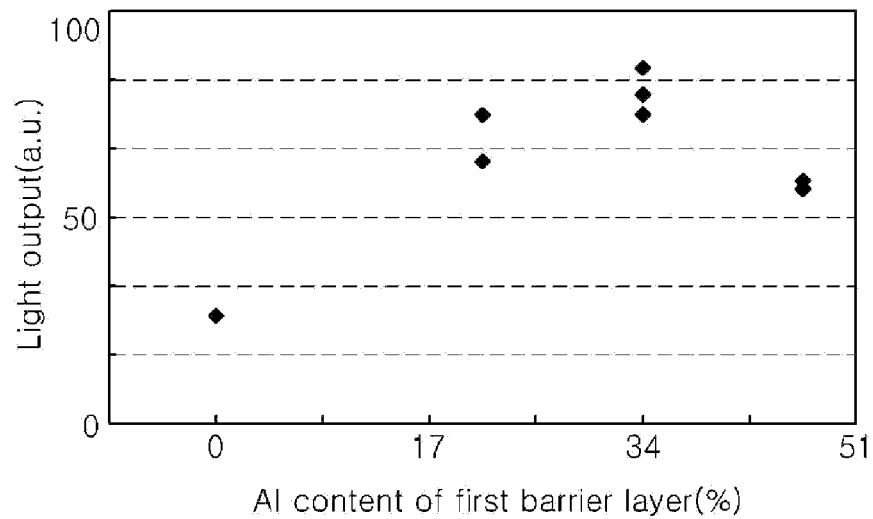
FIG. 3 is a graph depicting light output versus Al content of a first barrier layer of the multi-quantum well structure of the light emitting device according to the exemplary embodiment of the present invention.

In order to check the variation in light output according to the Al content in the first barrier layer 39b closest to the n-type contact layer 27, epitaxial layers were grown by MOCVD under the same conditions, except for the Al content in the first barrier layer. FIG. 3 is a graph depicting light output versus Al content of the first barrier layer. The barrier layers had the same composition except for the first barrier layer. The Al content of the respective barrier layers was measured using an atomic probe, and the other barrier layers contained about 20% of Al.

Referring to FIG. 3, when the Al content of the first barrier layer was 14% higher than those of the other barrier layers, the light emitting device had relatively high light output. On the other hand, when the first barrier layer did not contain Al, the light emitting device had relatively low light output. In addition, when the first barrier layer contained about 47% of Al, which was 27% higher than the Al content of the other barrier layers, a light emitting device sample had smaller light output than other light emitting device samples wherein the first barrier layer had the same Al content than the other barrier layers.

Experimental Example 2

Figure 4:
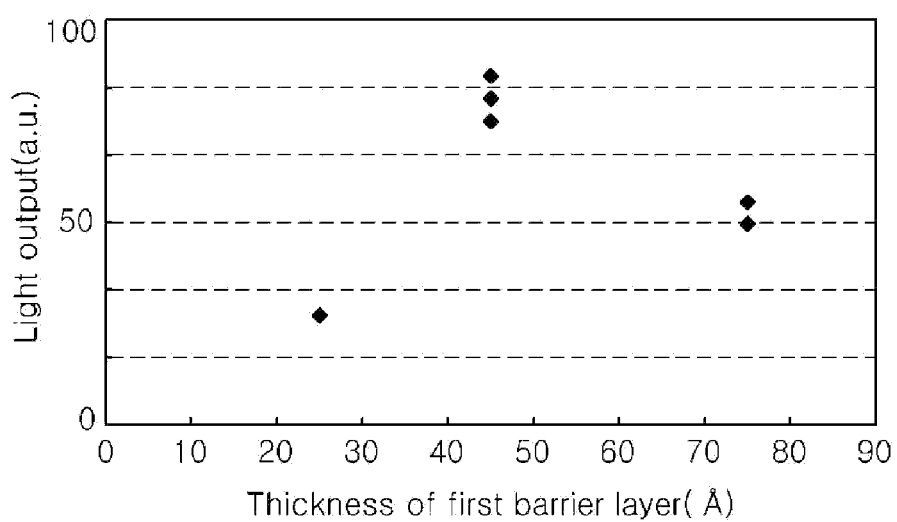
FIG. 4 is a graph depicting light output versus thicknesses of the first barrier layer of the multi-quantum well structure of the light emitting device according to the exemplary embodiment of the present invention.

In order to check light variation in light output according to the thickness of the first barrier layer 39b closest to the n-type contact layer 27, epitaxial layers are grown by MOCVD under the same conditions except for the thickness of the first barrier layer. FIG. 4 is a graph depicting light output versus thickness of the first barrier layer. All of the barrier layers except for the first barrier layer and the last barrier layer closest to the p-type contact layer 43 were formed to a thickness of about 45 Å, and the last barrier layer was formed to a relatively thick thickness of about 75 Å. Moreover, the first barrier layer had an Al content of about 34%, and the other barrier layers had an Al content of about 20%.

Referring to FIG. 4, when the first barrier layer had a thickness of 45 Å, which is the same as the other barrier layers, the light emitting device had relatively high light output. On the other hand, when the first barrier layer had a thickness of 25 Å, the light emitting device had relatively low light output, and even in the case where the first barrier layer had a thick thickness of 75 Å, the light emitting device had relatively low light output.

In a near ultraviolet light emitting device in the related art, an n-type contact layer is formed of AlGaN. Since a contact layer occupying most of the thickness of the near UV light emitting device except for the substrate is formed of AlGaN, light loss by light absorption can be prevented, but it is difficult to improve light output or light extraction efficiency due to low crystal quality of epitaxial layers therein. According to embodiments, since all or most of n-type contact layers and p-type contact layers are formed of gallium nitride, it is possible to improve crystal quality of an active area. Thus, the light emitting device according to the embodiments can have improved light output by preventing light loss due to light absorption.

Furthermore, since a first barrier layer contains a greater amount of Al than other barrier layers, the light emitting device according to the embodiments can have further improved light output. Moreover, the near ultraviolet light emitting device can reduce light loss due to light absorption by enhancing crystal quality of n-type and p-type contact layers.

Figure 5:
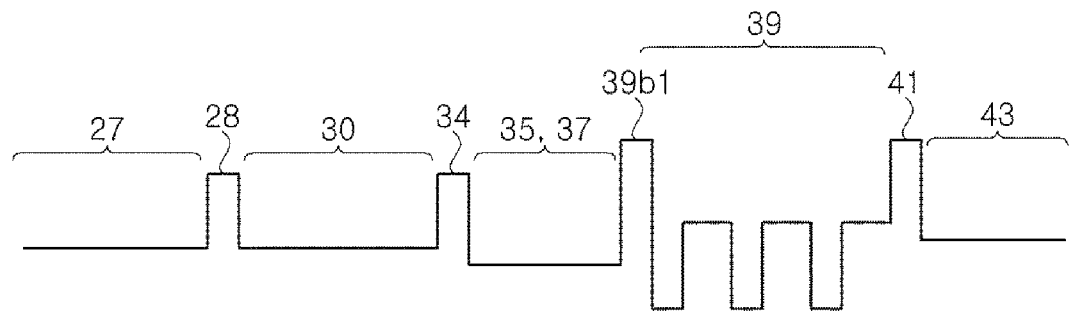
FIG. 5 is a schematic band-gap diagram illustrating an energy band-gap according to an exemplary embodiment of the present invention.

FIG. 5 is a schematic band diagram illustrating energy band-gap according to an exemplary embodiment of the present invention. In FIG. 5, the conduction band is schematically shown for simplification.

Referring to FIG. 5, the first electron control layer 28 is disposed between the n-type contact layer 27 and the anti-electrostatic discharge layer 30. A second electron control layer 34 is disposed between the anti-electrostatic discharge layer 30 and the super-lattice layer 35. In addition, the first barrier layer 39b1 of the active area 39 may disposed closer to the super-lattice layer 35 as compared with well layers or other barrier layers that may be included in active area 39. The electron control layers 28 and 34 have a higher band gap than adjacent layers and thus act as barriers for electrons moving from the n-type contact layer 27 to the active area 39. Particularly, the first electron control layer 28 has a higher band gap than the n-type contact layer 27 and the second electron control layer 34 has a higher band gap than the anti-electrostatic discharge layer 30. The first barrier layer 39b1 also has a higher band gap than the super-lattice layer 35 or the electron implantation layer 37 and thus acts as a barrier for electrons implanted from the super-lattice layer 35 into the active area 39.

As shown, the first barrier layer 39b1 and the electron control layers 28 and 34 are disposed between the n-type contact layer 27 and the active area 39, thereby delaying the flow of electrons. As a result, electrons may be prevented from deviating from the active area 39 instead of recombining with holes, thereby improving the recombination rate of the electrons and holes. Thus, a light emitting diode employing the electron control layers 28 and 34 may exhibit improved effects when operating at high current density.

Figure 6:
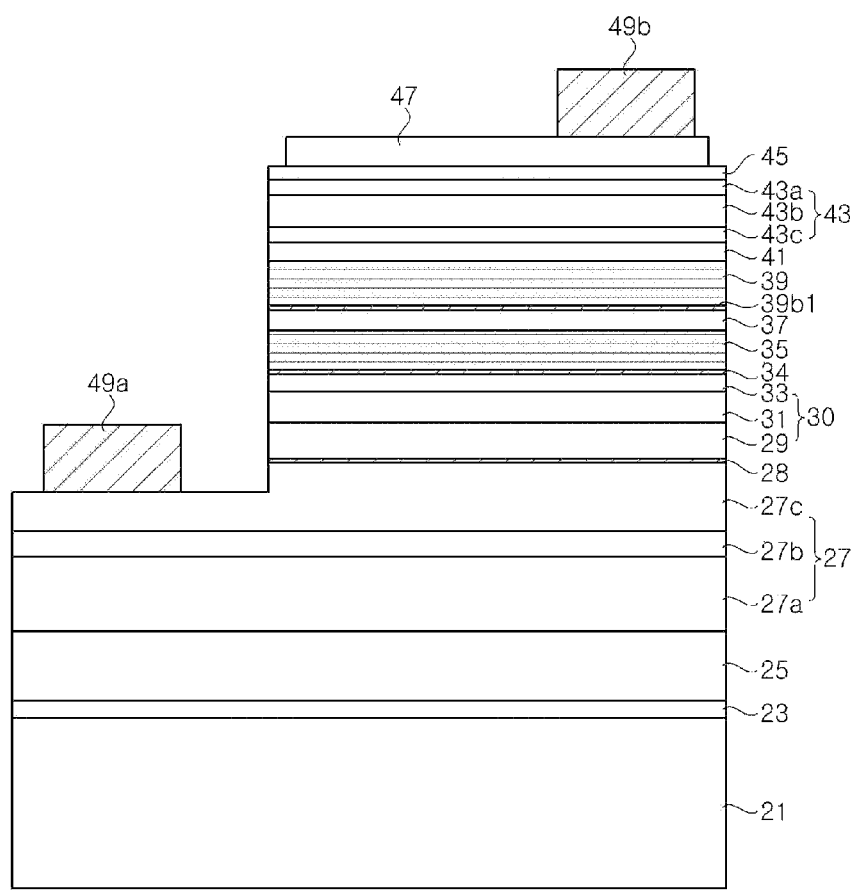
FIG. 6 is a schematic sectional view of a light emitting device including electrodes according to an exemplary embodiment of the present invention.

FIG. 6 is a schematic sectional view of a light emitting device including electrodes according to an exemplary embodiment of the present invention. FIG. 6 shows a lateral type light emitting device fabricated by patterning epitaxial layers grown on the substrate 21.

Referring to FIG. 6, the light emitting device includes a transparent electrode 47, an n-electrode 49a and a p-electrode 49b in addition to the substrate 21 and the epitaxial layers described with reference to FIG. 6. To avoid redundancy, the epitaxial layers described in FIG. 1 will not be repeated with reference to FIG. 6.

The transparent electrode 47 may be formed of, for example, indium tix oxide (ITO). The p-electrode 49b is formed on the transparent electrode 47. On the other hand, the n-electrode 49a contacts an exposed region of the n-type contact layer 27, particularly, an upper surface of the upper AlGaN layer 27c, which may be exposed by etching the epitaxial layers. The electron control layer 28 is disposed on the n-type contact layer 27, the exposed region of which contacts the n-electrode 49a, and may obstruct the flow of electrons traveling from the n-type contact layer 27 to the active area 39.

In this exemplary embodiment, a lateral type light emitting device is shown and illustrated. However, it should be understood that the present invention is not limited thereto. For example, a flip-chip type light emitting device may be fabricated by patterning the epitaxial layers grown on the substrate 21, or a vertical type light emitting device may be fabricated by removing the substrate 21.

Experimental Example 3

Figure 7:
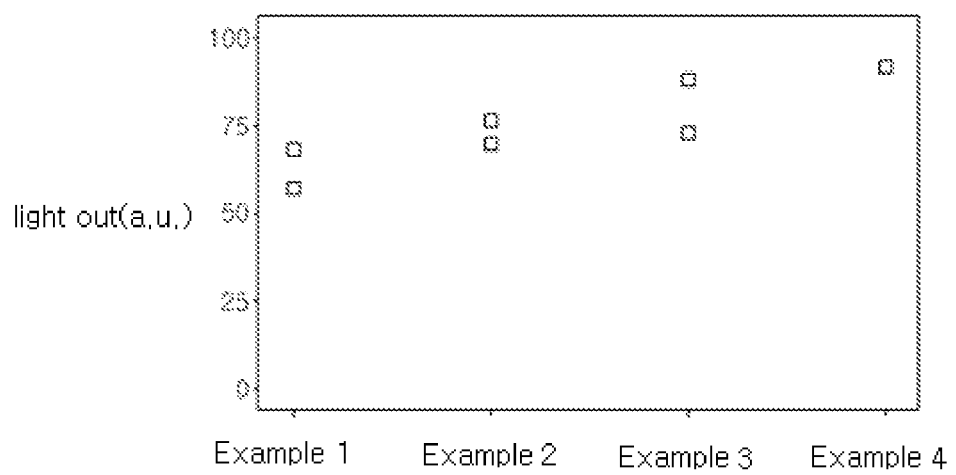
FIG. 7 is a graph depicting light output of light emitting devices according to an exemplary embodiment of the present invention.

With regards to FIG. 7, epitaxial layers were grown on a patterned sapphire substrate using an MOCVD system, as shown in FIG. 1, except for conditions for formation of electron control layers 28, 34. In the experimental embodiment corresponding to Example 1 of FIG. 7, the electron control layers 28 and 34 were not formed and a first barrier layer having a thickness of about 5 nm included about 40% Al. On the other hand, light emitting devices of Examples 2, 3, and 4 of FIG. 7 were fabricated under the same conditions as those of the light emitting device according to Example 1 of FIG. 7, except that the electron control layers 28 and 34 were formed. Each of the electron control layers 28 and 34 had a thickness of about 5 nm. In the light emitting devices of Examples 2 to 4 of FIG. 7, each of the electron control layers 28 and 34 were formed having Al contents of about 10%, about 15%, and about 20%, respectively. The Al content was measured using an atomic probe. In each of the examples, the n-type contact layer 27 and the anti-electrostatic discharge layer 33 had an Al content of about 9% and the super-lattice layer 35 had an Al content of about 8%.

In each of Examples 1 to 3 of FIG. 7, two wafers were prepared. However, a single wafer was prepared in Example 4 of FIG. 7. Then, light output of each of the light emitting devices was measured at the wafer level. An average light output value for each of the wafers is shown in FIG. 7.

The light emitting devices of Examples 2 and 3 of FIG. 7, in which the electron control layers 28 and 34 were formed, generally exhibited higher light output than the light emitting device of Example 1 of FIG. 7, in which the electron control layer was not formed. In addition, light output of the light emitting device increased with increasing Al content in the electron control layers 28 and 34.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting device comprising:
    an n-type contact layer comprising an AlGaN layer or AlInGaN layer;
    a p-type contact layer comprising an AlGaN layer or AlInGaN layer;
    an active area disposed between the n-type contact layer and the p-type contact layer, and having a multi-quantum well structure;
    at least one electron control layer disposed between the n-type contact layer and the active area;
    a super-lattice layer disposed between the n-type contact layer and the active area; and
    an electron implantation layer disposed between the super-lattice layer and the active area,
    wherein the electron implantation layer has a higher n-type impurity doping concentration than the super-lattice layer,
    wherein the first barrier layer contacts the electron implantation layer,
    wherein the active area comprises barrier layers and well layers, the barrier layers being formed of AlInGaN or AlGaN and comprising a first barrier layer that is disposed closer to the n-type contact layer than any other barrier layer and that comprises a higher percentage of Al than any other barrier layer, and
    wherein the electron control layer is formed of AlInGaN or AlGaN and contains a higher percentage of Al than adjacent layers, such that the electron control layer is configured to obstruct the movements of electrons into the active area.

2. The light emitting device of claim 1, wherein the first barrier layer comprises 30% to 50% Al.

3. The light emitting device of claim 2, wherein the other barrier layers except for the first barrier layer comprise AlInGaN or AlGaN comprising 10% to 30% Al and 1% or less In.

4. The light emitting device of claim 3, wherein the first barrier layer comprises AlInGaN comprising 1% or less In.

5. The light emitting device of claim 1, further comprising:
    an anti-electrostatic discharge layer disposed between the n-type contact layer and the super-lattice layer;
    wherein the first electron control layer is disposed between the anti-electrostatic discharge layer and the super-lattice layer.

6. The light emitting device of claim 5, wherein the anti-electrostatic discharge layer comprises:
    an undoped AlGaN layer;
    a low concentration AlGaN layer comprising a lower concentration of n-type impurities than the n-type contact layer;
    and a high concentration AlGaN layer comprising a higher concentration of n-type impurities than the low concentration AlGaN layer, wherein
    the low concentration AlGaN layer is disposed between the undoped AlGaN layer and the high concentration AlGaN layer, and
    the first electron control layer is disposed directly adjacent to the high concentration AlGaN layer.

7. The light emitting device of claim 5, wherein the n-type contact layer and the super-lattice layer each comprise less than 10% of Al, and the first electron control layer comprises 10% to 20% of Al.

8. The light emitting device of claim 5, wherein a second electron control layer is disposed between the n-type contact layer and the anti-electrostatic discharge layer.

9. The light emitting device of claim 8, wherein the n-type contact layer and the anti-electrostatic discharge layer comprise less than 10% Al, and the second electron control layer comprises 10% to 20% Al.

10. The light emitting device of claim 8, wherein the n-type contact layer comprises:
    a lower gallium nitride layer;
    an upper aluminum gallium nitride layer; and
    an intermediate layer comprising a multilayer structure and disposed between the lower gallium nitride layer and the upper aluminum gallium nitride layer.

11. The light emitting device of claim 10, wherein the intermediate layer comprises alternately stacked AlInN and GaN layers.

12. The light emitting device of claim 10, wherein the second electron control layer contacts the upper aluminum gallium nitride layer.

13. The light emitting device of claim 8, wherein the n-type contact layer comprises a modulation-doped AlGaN layer.

14. The light emitting device of claim 1, further comprising an n-electrode electrically connected to the n-type contact layer,
    wherein the electron control layer contacts the active layer.

15. The light emitting device of claim 1, wherein the active area is configured to emit near UV light in a wavelength range of 360 nm to 390 nm.

16. The light emitting device of claim 15, wherein the well layers comprise InGaN.

* * * * *